United States Patent

Lefferts

[15] 3,671,780

[45] June 20, 1972

[54] CONTROL CIRCUITS

[72] Inventor: Peter Lefferts, Hopewell, N.J.

[73] Assignee: Heinemann Electric Company, Lawrence Township, N.J.

[22] Filed: Nov. 24, 1969

[21] Appl. No.: 879,173

[52] U.S. Cl. ....................307/252 UA, 307/246, 307/252 N, 307/308, 328/67

[51] Int. Cl. ........................................................H03k 17/00

[58] Field of Search ..........307/308, 252.51, 252.70, 252.74, 307/246, 301; 328/67

[56] References Cited

UNITED STATES PATENTS

| | | | |
|---|---|---|---|
| 3,183,372 | 5/1965 | Chin | 307/252 |
| 3,206,615 | 9/1965 | Pointe | 307/252 |
| 3,321,641 | 5/1967 | Howell | 307/252 |
| 3,331,139 | 7/1967 | Finnegan | 307/252 |
| 3,411,020 | 11/1968 | Lake | 307/252 |
| 3,443,124 | 5/1969 | Pinckaers | 307/252 |
| 3,484,673 | 12/1969 | Strobel | 307/246 |
| 3,146,392 | 8/1964 | Sylvan | 307/301 |

*Primary Examiner*—Donald D. Forrer
*Assistant Examiner*—David M. Carter
*Attorney*—Denny & Denny

[57] ABSTRACT

Circuits for generating a control pulse in response to a change in an external condition, by charging a capacitor from a pulsating direct current source over a substantial part of the source pulsation and discharging the capacitor rapidly near the zero crossover point of the pulsation. Subsequently the control pulse is applied to a power switching device, in particular the cathode terminal of a controlled rectifier.

14 Claims, 6 Drawing Figures

INVENTOR.
PETER LEFFERTS
BY Denny and Denny
HIS ATTORNEYS.

INVENTOR.
PETER LEFFERTS
BY Denny and Denny
HIS ATTORNEYS.

INVENTOR.
PETER LEFFERTS
BY Denny and Denny
HIS ATTORNEYS.

CONTROL CIRCUITS

BACKGROUND OF THE INVENTION

This invention relates generally to circuits for continuously monitoring an external condition and generating a control signal in response to a change in said condition. The control signal may be used to actuate a controller to compensate for the change and to return the system to the desired condition.

Prior art systems for accomplishing this have proved to be unsatisfactory in various ways. In particular many lack the necessary sensitivity to be usable for certain applications. Control systems of the type described in this application must be capable of responding to extremely small changes in external conditions. In order to accomplish this the sensing circuits must be triggerable by extremely low level input signals. It would, therefore, be desirable to employ some means for amplifying the low level input in order to achieve greater sensitivity.

Prior art systems have been normally constructed to operate from a steady d.c. voltage source such as a battery or a full wave rectified and filtered alternating source. These systems are more expensive to construct initially due to the cost of the filtering components and battery, and in addition, are frequently affected by variations in the supply output. The use of higher quality components to insure long life accuracy further adds to the cost of such systems.

It is, therefore, an object of this invention to provide a control circuit which is sensitive to extremely low level input signals.

It is a further object to provide a means for amplifying a low level input signal before applying it to a power switching device in order to increase the sensitivity of the control circuits.

A further object is to operate the control circuits from a pulsating d.c. source, thereby eliminating the need for filtering the ordinary full wave rectified alternating power supply.

A still further object is to generate triggering pulses which are synchronized to the pulsating d.c. source and occur at or near the zero-crossover point in the source cycle.

A further object is to provide a circuit which reduces the trigger current required to switch a silicon controlled rectifier.

A still further object is to provide a control system having the above mentioned qualities and which is extremely versatile, simple in design and inexpensive to construct.

BRIEF SUMMARY OF THE INVENTION

These and other objects are accomplished by a circuit for generating a control pulse which includes circuit means having a long time constant for charging a capacitor over substantially the entire pulsation of the d.c. supply and for discharging the capacitor rapidly at or near the point of zero-crossover of the supply pulsation. The control pulses are, thereby, synchronized to the supply.

In some embodiments of the invention a silicon controlled rectifier (SCR) is employed as a power switch. The common method of triggering such an SCR is to apply a positive voltage to the gate terminal. It has been found that by holding the gate terminal at a fixed potential and applying a negative trigger to the cathode terminal, a marked increase in sensitivity is achieved. It is thus possible to trigger the SCR by a current which is 10–20 times smaller than previously needed. An even further decrease in the triggering current required to switch an SCR is achieved by providing a low impedance path for the trigger current to flow to ground during regeneration.

Various other embodiments of the circuits according to the invention provide for different methods of initiating and controlling the charging of the trigger capacitor.

BRIEF DESCRIPTION OF THE DRAWINGS

This invention will be better understood with reference to the drawings in which.

DESCRIPTION OF THE PREFERRED EMBODIMENTS

Figure 1:
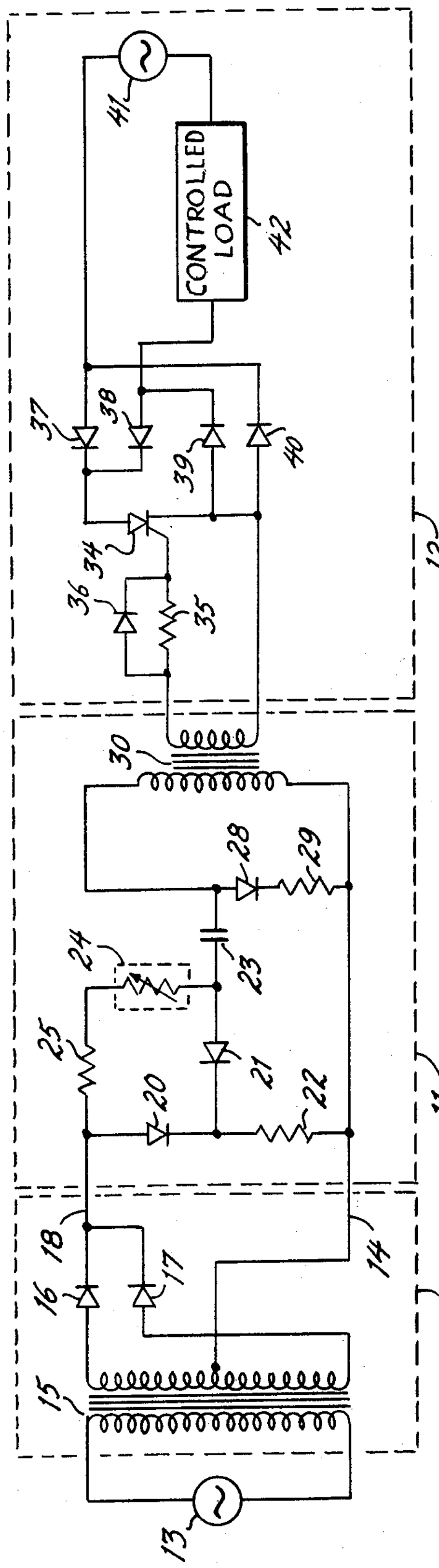
FIG. 1 is a schematic diagram of a circuit which illustrates the concept of generating a trigger pulse by charging a trigger capacitor from a d.c. source over substantially the entire source pulsation and subsequently discharging it rapidly near the zero crossover point in the source cycle and in which the trigger capacitor is charged through a condition responsive resistor.

In FIG. 1 the trigger circuit of the invention is shown as a part of a typical control system. The system is composed generally of three separate sections. Section 10 supplies a pulsating direct current from an alternating source. Section 11 senses a change in an external condition and translates this change into a control signal suitable t operate a compensating section 12 which includes a power switching device, whereby the proper external condition is again re-established.

The pulsating direct current is generated by means of an alternating current source 13 which can be stepped up or down by means of a transformer 15 according to the required operating conditions of the circuit. The secondary of the transformer is center tapped to provide a return line 14 for the circuit. The opposite ends of the transformer secondary are connected to a full wave rectifier which consists of the diodes 16 and 17. A diode 20 and resistor 22 are connected in series between line 18 and the return line 14 with the anode of diode 20 being connected to the line 18. One side of a capacitor 23 is coupled to line 18 via serially connected resistor 25 and condition responsive resistor 24, the resistor 24 varying according to changes in an external condition. The same side of capacitor 23 is also connected through a diode 21 to the junction between diode 20 and resistor 22. Two branches are connected in parallel between the other side of capacitor 23 and reference line 14. The first consists of the primary winding of transformer 30 and the second contains the diode 28 and resistor 29 connected in series. The secondary of transformer 30 is serially coupled into the gate-cathode circuit of SCR 34 by means of current limiting resistor 35 and diode 36, connected to shunt resistor 35. Diode rectifiers 37–40 are coupled to the anode and cathode terminals of SCR 34 and to a.c. power source 41 in a conventional fashion to allow the application of power to the controlled load 42 upon the occurrence of a proper trigger pulse on the gate terminal of SCR 34. The controlled load 42 in turn compensates for the change in the external condition detected by the condition responsive resistor 24, and completes a closed loop control system.

The controlled load 42 may consist of a variety of condition controlling elements such as heating coils, light emitting devices, solenoid operated valves, etc.

In operation, a full wave rectified signal will be present on line 18. As the voltage on line 18 rises, capacitor 23 charges through resistor 25 and condition sensitive resistor 24. The charge path also includes the diode 28 and the resistor 29. The components in the charge path are selected to result in a long time constant in relation to the duration of the voltage pulses on line 18. Thus, the capacitor 23 charges during substantially the entire duration of the pulsation of the supply and rises to only a small fraction of its peak value. The side of the capacitor 23 nearest line 18 becomes positive with respect to its other side. During the charging of capacitor 23 the diodes 20 and 28 are forward biased while the diode 21 is reversed biased. As the voltage on line 18 swings downward the potential at the junction of diode 20 and resistor 22 falls and a point is reached at which the diode 21 becomes forward biased due to the polarity of the potential on the capacitor 23, thereby allowing capacitor 23 to discharge through resistor 22 to ground, the discharge path including the primary of the transformer 30. By selecting a long charge time constant the point at which capacitor 23 will discharge will be very nearly at the zero potential of the supply line 18. The components in the discharge paths in this case resistor 22, diode 21 and the transformer primary 30 are selected to produce a rapid discharge of the capacitor. An instantaneous current gain is realized, by the combination of long charge and short discharge of the capacitor 23. The current gain results from the charging of a capacitor by means of a small current over a long time period and the rapidly releasing all the stored current in a very small time period.

The rapid discharge of capacitor 23 produces a current pulse in the primary and secondary of transformer 30, thereby gating the SCR 34 into conduction near the zero crossover point of each cycle of the full wave rectified voltage on line 18.

The components of the circuit of FIG. 1 are chosen such that the trigger pulse delivered to the SCR 34 in the presence of the desired external condition is just below that needed to turn it on. A slight change in the resistance 24 alters this initial condition sufficiently to allow the firing of the SCR, thereby energizing controlled load 42 to re-establish the proper external condition.

In effect, the external condition is monitored continuously on each rise and fall of potential at junction 18. Any small change in current through element 24 caused by a change in condition is amplified by charging the capacitor 23 over a large portion of the d.c. pulsation on line 18 and discharging the capacitor in a relatively short time. Thus, a small change in the average current through condition responsive resistor 24 results in a large increase in magnitude of the instantaneous discharge current from capacitor 23. Several types of commonly used heat, light and pressure sensitive elements may be utilized as the condition sensitive element 24 in the circuit of FIG. 1. In addition, other power switching devices or amplifying circuits may be used in place of the SCR. The same source of a.c. power may be connected to operate the compensating and sensing subcircuits.

Figure 2:
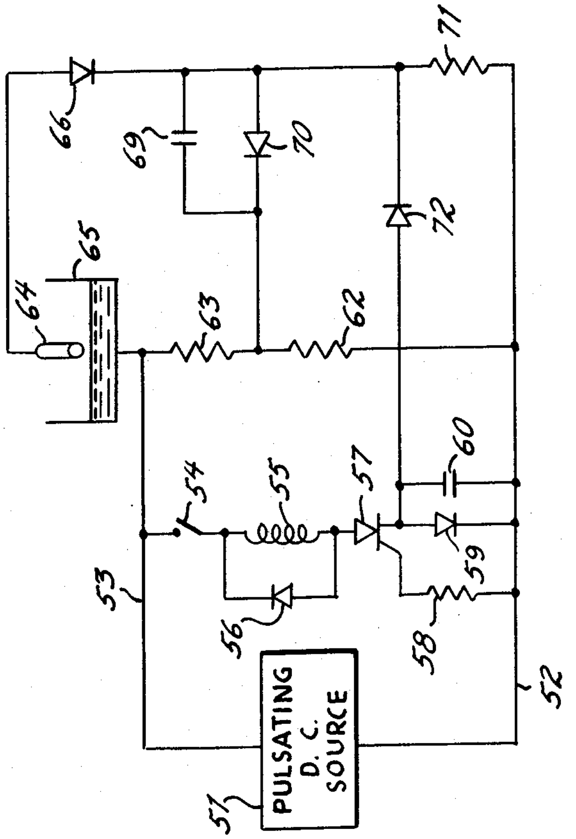
FIG. 2 is a circuit diagram which illustrates the use of the trigger circuit of the invention in a system for controlling the amount of a liquid in a container and in which the control pulse is applied to the cathode of an SCR.

FIG. 2 shows a control system which is operable to control the level of an electrically conductive liquid held in a container 65. As in FIG. 1 a source of pulsating d.c. 51 is used to power the circuit and may be provided in a manner similar to that shown in FIG. 1, with the lines 53 and 51 of FIG. 2 corresponding to the lines 18 and 14 of FIG. 1, respectively.

One side of a switch 54 is connected to the source 51. The other side of the switch is connected to the anode side of a diode 56 and one side of a solenoid coil 55. The other side of the coil 55 is connected to the cathode of the diode 56 and also to the anode of the SCR 57. The gate terminal of the SCR 57 is connected via resistor 58 to the return line 52. The cathode terminal of the SCR is connected to the return line 52 via the parallel combination of diode 59 and capacitor 60, the anode side of the diode 59 being connected to the cathode of the SCR 57. The cathode is further coupled to the return line through the series combination of diode 72 and resistor 71, the anode side of diode 72 being connected to the cathode of the SCR 57. A voltage divider consisting of resistors 63 and 62 is connected across the source 51. A second path across the source 51 consists of the conductive path from the container 65 to the probe 64 via the liquid in the container and the serially connected diode 66 and resistor 71, the anode side of the diode 66 being connected to the probe 64. The parallel combination of diode 70 and capacitor 69 is coupled between the junction of resistors 63 and 62 and diode 66 and resistor 71.

When the switch 54 is closed the circuit will function to allow liquid to enter vessel 65 until it comes in contact with the probe 64 at which point the flow of water to the vessel is stopped. A valve (not shown) or any other suitable device may be operatively coupled to the solenoid coil 55 to allow the liquid into the vessel 65 when the winding is energized by turning SCR 57 on. The SCR 57 is gated in to the conducting state by means of a negative pulse coupled into its cathode lead by the discharge of capacitor 69.

As the full wave rectified signal on line 53 rises positively, and assuming the probe 64 is not in contact with the liquid in container 65, capacitor 69 charges through resistors 63 and 71, the capacitor 69 and resistor 63 and 71 being selected to have a long time constant relative to the duration of the d.c. fluctuation from the source 51, the side of capacitor 69 connected to resistor 71 becoming negative. The time constant is selected such that the voltage across the capacitor 69 rises to only a small percentage of the peak voltage of the source 51, as discussed with reference to FIG. 1, thereby allowing the capacitor 69 to charge during substantially the entire d.c. pulse. As the voltage on line 53 decreases the junction between the resistors 62 and 63 is pulled to ground and the cathode of the SCR which is coupled to the negatively charged side of the capacitor 69 is forced below ground, reverse biasing diode 59 and allowing the cathode of the SCR 57 to be driven negative with respect to the gate. With the cathode terminal of the SCR 57 negative and the gate at ground potential via resistors 58, a trigger current will flow in the gate-cathode circuit of the SCR thereby turning it on as the anode potential rises. With the SCR in a low impedence state a current flows through relay 55 which actuates a valve mechanism (not shown) to allow the liquid to enter the vessel 65.

A small capacitor 60 connected between the cathode of the SCR and ground, although not necessary for circuit operation, further increases the sensitivity of the circuit. The capacitor 60 operates to support a current while the SCR is regenerating and moving from an operating condition with the cathode below ground, to a condition when the diode 59 is conducting and the cathode of the SCR is above ground. Capacitor 60 is selected to provide a low impedence path to ground for the gate cathode trigger current. The diode 56 is connected across the coil 55 to absorb inductive spikes generated by the inductance of the coil.

As in the circuit of FIG. 1 the time constant for the charging of capacitor 69 is made long in comparison to the discharge time constant in order to result in an instantaneous current gain, as explained hereinbefore.

It can be seen from the circuit of FIG. 2 that the SCR is triggered by holding its gate at a reference potential and driving its cathode negative with respect to the gate. This is in contrast to the commonly employed technique of triggering an SCR by holding the cathode terminal at a reference potential and raising the potential of the gate sharply with respect to the cathode. The cathode triggering technique has been found to result in a significant reduction in the current needed to trigger the SCR. Test results have shown that a current which is 20 to 30 times smaller than that needed in a conventional gate triggering circuit, can successfully trigger the SCR.

When the liquid in container 65 rises into contact with the probe 64, the capacitor 69 will be short circuited, thereby preventing it from charging and thus ending the trigger pulses to the SCR.

By selecting the capacitor 69 to be sufficiently large, a time delay may be introduced into the circuit of FIG. 2. Momentary short circuits caused by splashing liquid coming with contact with probe 64 will not persist long enough for the charge on capacitor 69 to dissipate to a point where it is insufficient to trigger the SCR.

If the liquid being monitored is water, diode 66 prevents what is known as "fuel cell" effect, which appears to be a general fault of water level detectors operating on pulsating direct current. This condition results in a thin film of hydrogen bubbles being formed on probe 64 due to the negative flow of current in this part of the circuit. As line power goes through zero the water container and the probe make up an oxygenhydrogen fuel cell battery causing the probe to go negative with respect to the remainder of the circuit. If diode 66 were not used, the charge passed to the capacitor 69 might be enough to trigger the SCR even though it should not do so with the probe in the water.

Figure 3:
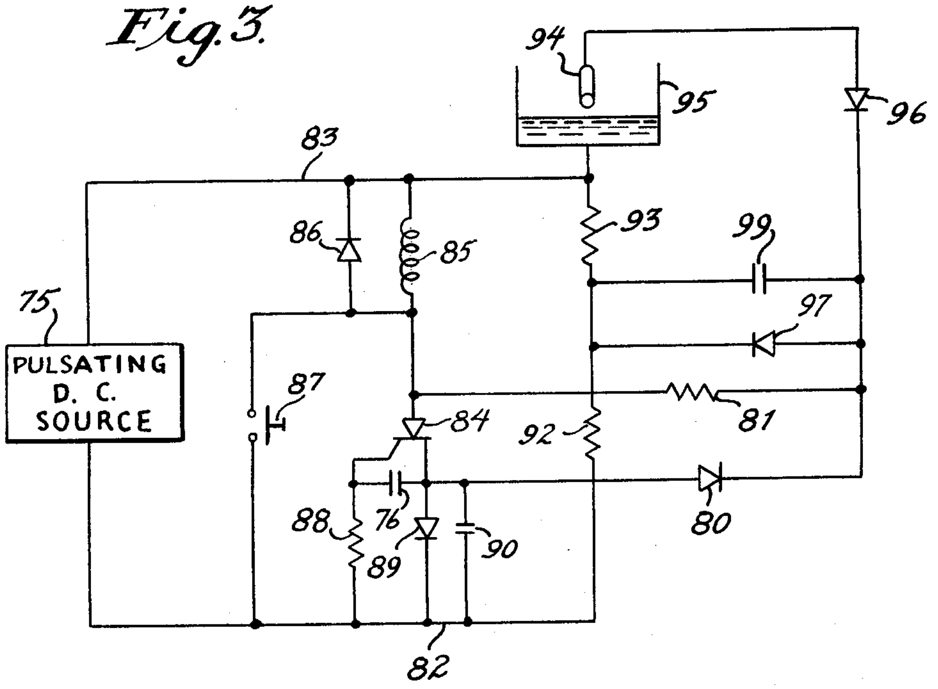
FIG. 3 shows a circuit basically similar to FIG. 2 in which the trigger capacitor is coupled to the anode of an SCR.

The circuit of FIG. 3 is similar in many respects to the circuit of FIG. 2. In FIG. 3 a relay 85 and a diode 86 are connected in parallel between the anode of the SCR 84 and one side of the d.c. pulsating supply. The cathode terminal of the SCR 84 is connected to the return line 82 via the parallel combination of diode 89 and capacitor 90 and the gate terminal is connected to the return line 82 via resistor 88. A capacitor 76 is connected across the gate and cathode terminals of the SCR 84. A push button switch 87 is connected from the anode of the SCR 84 to the line 82.

A voltage divider consisting of resistors 93 and 92 is connected across the source 75. The liquid holding container 95, probe 94 and diode 96 are connected in series between one end of the supply 75 and one side of the capacitor 99, diodes 80 and 97 and resistor 81. The other side of the capacitor 99 and diode 97 are connected to the junction of the resistors 93 and 92 while the other side of resistor 81 is connected to the anode of the SCR 84. The other side of diode 80 is connected to the cathode of the SCR 84.

A first change to be noted with respect to the circuit of FIG. 3 as compared to the circuit of FIG. 2 is that the capacitor 99 is returned to the anode of the SCR 84 through resistor 81. Further, a push button switch 87 is provided across the SCR 84 to initiate the action of the circuit. As before, a valve (not shown) may be operatively coupled to relay 85 to allow a liquid to flow into the container upon energization of the relay 85.

Assuming that no liquid is in the container 95, the action of the circuit is initiated by momentarily depressing the push button 87. This results in a flow of current from line 83 through the relay 85 to the return line 82, energizing the relay and allowing the liquid to begin filling the container by operating a valve (not shown). In addition, capacitor 99 will charge from the pulsating supply 75 through resistors 93 and 81 and the switch 87, the side of the capacitor connected to the resistor 93 becoming positive. As the voltage pulsation on line 83 falls toward ground, the positive side of the capacitor 99 will be grounded, thereby driving the negative side of the capacitor 99 below ground. Since the negative side of the capacitor 99 is connected to the cathode of the SCR 84 via diode 80 while the gate is held at ground potential via resistor 88, a gate current flows to discharge the capacitor 99 and trigger the SCR. The diode 89 operates in the same manner as diode 59 of FIG. 2 to allow the cathode to be driven negative during regeneration and to allow current to flow when the SCR 84 is conducting. Capacitor 90 operates in a similar manner as does capacitor 60 in circuit of FIG. 2.

With the SCR conducting, and the push button 87 released the capacitor 99 will charge on the each successive cycle of the pulsating source through the diode 89, the SCR 84, and resistors 81 and 93. Trigger pulses to the SCR will continue until the liquid in the container 95 touches the probe 94. When this occurs the capacitor 99 will be shunted by a substantially short circuit path which includes the container 95, the conductive liquid in the container, the probe 94 and the diode 96. As a result of shorting the capacitor 99 the SCR will not be triggered and will be turned off by the drop in anode potential. This will result in de-energization of the relay 85 and closing of the valve (not shown), thereby cutting off the flow of liquid into container 95.

As in the previously described circuits, the time constant of the charging circuit associated with capacitor 99 is designed to be long in contrast to the duration of the d.c. pulses from source 75 and also in relation to the time constant of capacitor 99 on discharge. Diode 96 functions in a similar manner as diode 66 in the circuit of FIG. 2.

Returning the resistor 81 to the anode of the SCR 84 and adding switch 87 allows the SCR to trigger only after the relay 85 has been energized by means of switch 87 and prevents the SCR from being triggered at all once the water has even momentarily shorted out the triggering signal.

Figure 4:
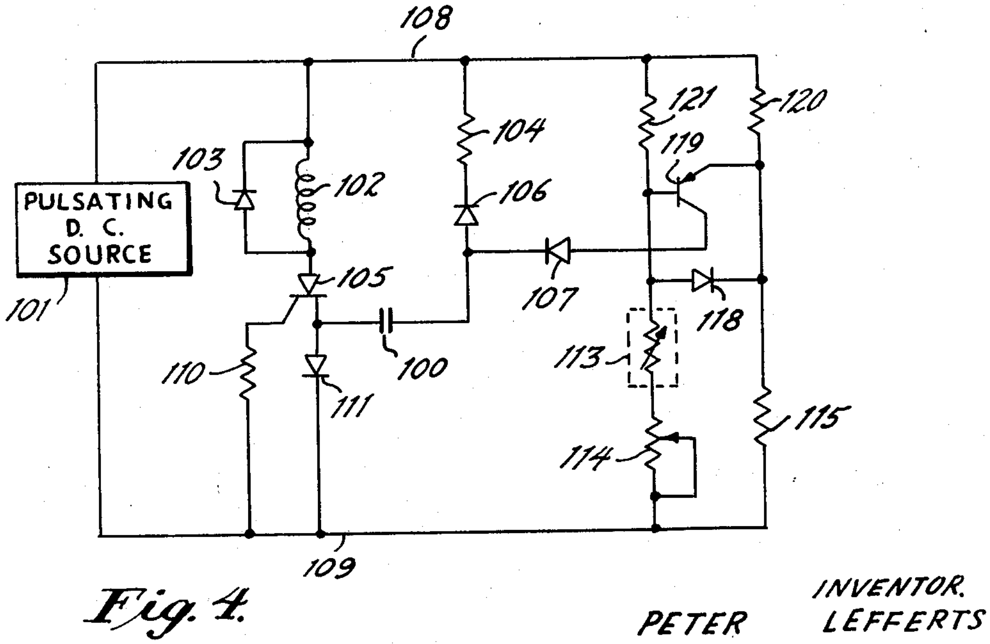
FIG. 4 shows a circuit in which the trigger capacitor charges through a transistor which is switched by means of a sensor resistance.

In the circuit of FIG. 4, a pulsating d.c. source 101 is provided as in the circuit of FIG. 1 with the lines 108 and 109 corresponding to the lines 18 and 14 of FIG. 1. The diode 103, coil 102, SCR 105, resistor 110 and diode 11 are connected in a manner similar to that shown in FIG. 2 and perform the same functions as described in reference to the circuit of FIG. 2.

One side of capacitor 100 is connected to the junction of the diode 111 and the cathode of the SCR 105. The other side of the capacitor is connected to one side of the pulsating supply through diode 106 and resistor 104, the cathode side of the diode 106 being nearest to the supply. A transistor 119 has its emitter connected to a voltage divider consisting of resistors 120 and 115, and its base connected to the voltage divider consisting of resistor 121, variable resistor 114 and sensing resistor 113. The two voltage dividers provide the proper operating biases for the transistor. The collector of transistor 119 is connected via diode 107 to the capacitor 100. It is to be noted that the resistor 120, the emitter-collector terminals of the transistor 119, diode 107, capacitor 100 and diode 111 form a series path across the source 101. A diode 118 is connected between the junction of resistor 120 and 115 and the junction of resistor 121 and sensing resistor 113.

Initially, the potentiometer 114 is set so that with the condition responsive resistor 113 indicating the presence of a desired condition, the transistor 119 will not conduct. However, if the voltage at the junction of the resistor 121 and sensor resistor 113 becomes more negative due to a change in an external condition, the transistor 119 will be turned on early in the cycle of the pulsating source. As the voltage on line 108 rises and with the transistor 119 turned on, the capacitor 100 will charge during substantially the entire source pulsation due to the high charge time constant, as previously described with reference to FIG. 2, with the side of the capacitor 100 nearest the SCR 105 becoming negative. The charge path includes resistor 120, the emitter to collector junction of transistor 119 and the diodes 107 and 111.

During the charging cycle capacitor 100 is isolated from the power supply by means of diode 106. Diode 107 functions to prevent the charged capacitor from discharging back through the transistor 119 during low line voltage periods.

As the potential on line 108 decreases, the positive side of capacitor 100 will approach ground potential. The cathode of the SCR which is connected to the negative side of the capacitor 100 will, therefore, be negative with respect to ground and also negative with respect to the gate of the SCR 105 which is being held at ground via resistor 110. Diode 111 becomes reversed biased, as previously discussed, and serves to isolate the cathode of the SCR 105 thereby allowing it to be driven negative with respect to the gate. The difference in potential between the cathode and gate allows a trigger current to flow from ground through resistor 110, capacitor 100, diode 106 and resistor 104. Again, by selecting the time constant of the charging circuit to be long compared to the discharge time constant a current gain is realized resulting in a highly sensitive circuit. Thus, as long as the sensing resistor 113 drives transistor 119 into conduction, the SCR 105 will be triggered on approximately at the zero crossover point of each cycle of the supply 101. Diode 118, while not necessary to the operation of the circuits, is connected between the arms of the bridge to protect the emitter base junction of the transistor 92 from large voltages which may occur due to bridge unbalance.

Figure 5:
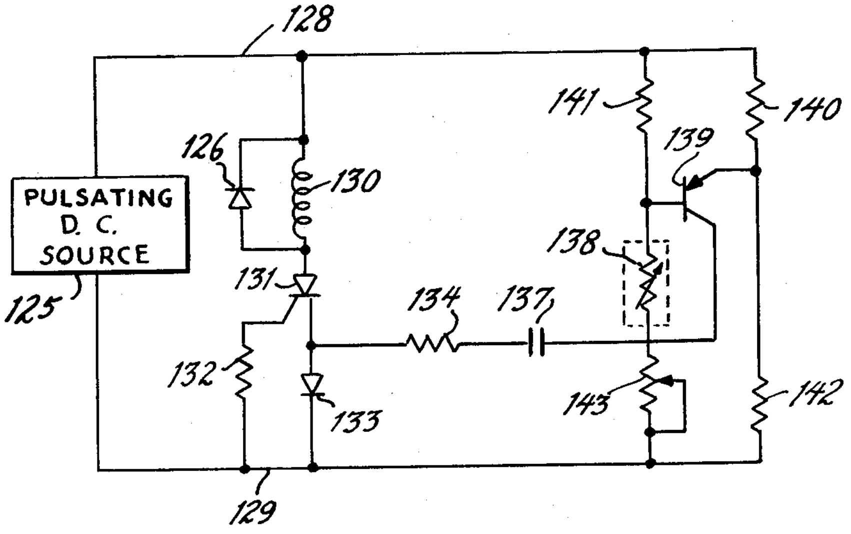
FIG. 5 is a simplified modification of the circuit of FIG. 4.

The circuit of FIG. 5 is a simplified version of the circuit of FIG. 4. Diodes 107 and 106 and resistor 104 have been eliminated from the circuit of FIG. 4 and their functions are now performed by the collector-base junction of the transistor 139 of FIG. 5. The trigger capacitor 137 is now connected directly to the collector of transistor 139. Capacitor 137 now charges from the supply 125 as before through the resistor 140, transistor 139, resistor 134 and diode 133 to ground with the side of the capacitor connected to the collector of transistor 139 going positive. Upon the collapse of the supply voltage, the positive side of the capacitor 137 is pulled to ground through the collector-base junction of transistor 139, thereby pulling the cathode of the SCR 131 below ground and triggering it on in a manner as hereinbefore explained with reference to FIG. 4. During the time the capacitor is charging very little current can flow across through the high impedence base to collector junction of transistor 139. In all other respects the circuit of FIG. 5 operates in the same manner as that of FIG. 4.

Figure 6:
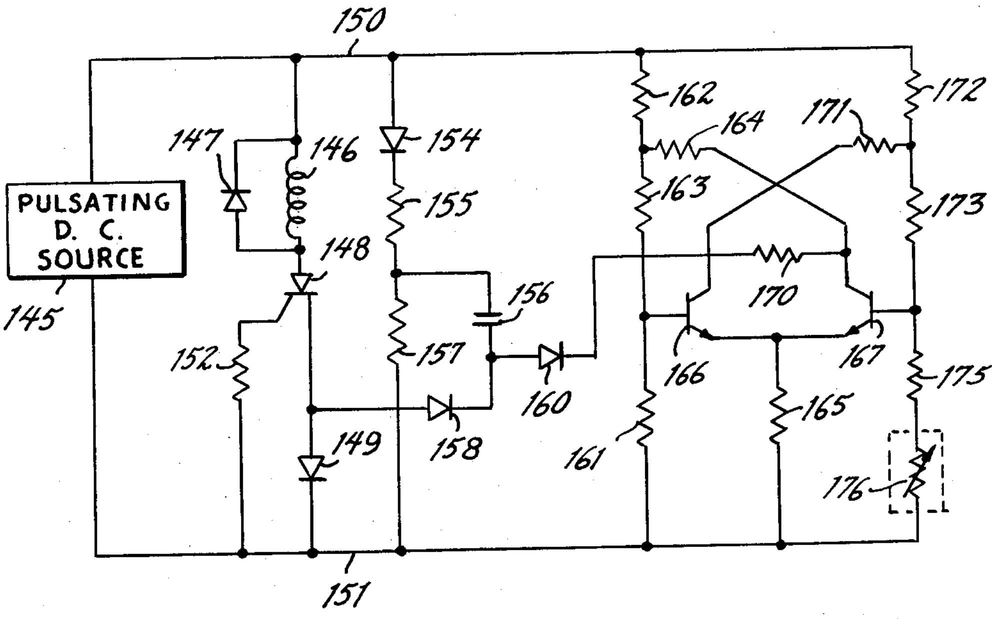
FIG. 6 shows a circuit in which a two-stage direct coupled amplifier with positive feedback is used to control the charging of the trigger capacitor.

In the circuit of FIG. 6 a two stage transiently regenerative amplifier is employed to further increase the sensitivity of the control circuit and to control the charging of the trigger capacitor 156.

The source of pulsating d.c. 145 and the components 146–149 and 152 function in the same manner as the corresponding components in the circuit of FIG. 2. One side of the trigger capacitor 156 is connected to a voltage divider consisting of diode 154, and resistors 155 and 157. The other side of the capacitor 156 is coupled to the cathode of the SCR 148 via diode 158.

Transistors 166 and 167 form part of a transiently regenerative amplifier, the details of which are fully discussed in U.S. Pat. No. 3,264,572. Briefly, however, the transistors 166 and 167 form a two stage direct coupled amplifier with positive feedback. The periodic power supply variations from source 145 continuously change the gain of each of the transistors. The collector of transistor 167 is connected to the base of transistor 166 via resistors 164 and 163, and, likewise, the collector of transistor 166 is connected to the base of transistor 167 via resistors 171 and 173 to form the positive feedback paths.

A first voltage divider consisting of resistors 161–163 initially establishes the potential of the base of transistor 166 and the collector of transistor 167 while a second divider consisting of the resistors 172, 173, 175 and condition responsive resistor 176 establishes the potential on the base of transistor 167 and the collector of transistor 166. The emitters of both transistors are connected to each other and to ground via the resistor 165. The collector of transistor 167 is connected to the capacitor 156 via the diode 160.

As explained in detail in the above cited patent, when the voltage on the collector of the transistors 166 and 167 rises, the total gain of the circuit becomes very high due to the positive feedback loop. At this point a very small difference in the potential of the bases of the transistors will cause one of the transistors to saturate while the other is turned off completely.

The circuit of FIG. 6 is designed such that up on the occurrence of an undesired change in the external condition being monitored by sensor resistor 176, the potential at the base of transistor 167 increases, causing a larger current to flow through transistor 167. This is accompanied by a drop in the collector potential of transistor 167 which is fed back via resistors 164 and 163 to the base of transistor 166 which tends to cut off current through transistor 166. Thus, almost instantaneously the transistor 167 saturates, and the transistor 166 is cut off thereby allowing the capacitor 156 to charge from the supply 145 through the components 154, 155, 160, 170, the collector-emitter circuit of transistor 167, and the resistor 165 to ground. It is to be noted that the transistor 167 saturates at an early point in the rise time of the pulsation of the source, thereby allowing the capacitor to charge during substantially the entire rise and fall of the source pulsation. As in the previous circuits, the capacitor 156 and the resistors 155, 170, and 165 which form a part of the charge path are selected to have a long time constant.

As the voltage of the supply falls toward ground, the positive side of the capacitor 156 is likewise pulled to ground through resistor 157. Since the gate of SCR 148 is held at ground potential via resistor 152 and since the negative side of the capacitor 156 is tied to the cathode of the SCR 148, a trigger current flows as explained hereinbefore with reference to the previous circuits. Diode 149 performs in the same manner as diode 59 in the circuit of FIG. 2. Diode 156 prevents the capacitor 156 from discharging back through the transistor 167.

Thus, as long as the sensing resistor drives the base of transistor 167 to a higher potential then the base of transistor 166, the transistor 167 will saturate shortly after the beginning of each pulsation from the supply 145, allowing the capacitor 156 to charge over the remainder of the cycle and subsequently discharge rapidly to trigger the SCR near the zero-crossover point of the power supply. The subsequent rise in supply voltage drives the anode of the SCR 148 positive and allows it to conduct, thereby energizing relay 146 which may be operatively coupled to a variety of compensating devices (not shown) in order to re-establish the desired external condition.

The circuits described herein are not limited for use with any specific source frequency although a lower frequency may enhance the sensitivity of the circuits by allowing a longer charge time for the trigger capacitor.

The trigger circuits of the invention which utilize the idea of storing a charge during substantially an entire d.c. pulse and releasing it as a trigger near the zero crossover point, may be used in conjunction with a variety of power switching devices such as silicon controlled switches, Shockly diodes, transistorized Schmitt triggers etc. Further, a variety of condition sensitive elements can be used in conjunction with the trigger circuits of the invention, such as photoresistors, heat sensors and pressure sensitive elements.

Having described this invention, what I claim is:

1. A circuit for generating a trigger pulse having a short duration with respect to the duration of a pulsation from a power source and synchronized to said source comprising, a capacitor coupled to said source, first circuit means responsive to the drop in the magnitude of said pulsation to a value below the magnitude of the voltage on said capacitor for charging said capacitor from said source to a maximum voltage which is a small percentage of the peak voltage of said source, said capacitor charging during substantially said entire source pulsation, and second circuit means for discharging said capacitor near the zero crossover point of said pulsation in a time period short with respect to the duration of the charging time of said capacitor to generate said trigger pulse.

2. The combination recited in claim 1 wherein said first circuit means includes a first resistor connected in series with said capacitor, said series combination of capacitor and first resistor connected across said source, and said second circuit means comprises a second resistor and a diode connected in series with each other between one side of said source and the junction of said capacitor and said first resistor, said second resistor being small relative to said first resistor, said diode being reverse biased during substantially said entire source pulsation and forward biased near the zero crossover point of said pulsation to discharge said capacitor near the zero crossover point of said pulsation.

3. The combination recited in claim 2 wherein said first resistor varies in magnitude in response to changes in an external condition.

4. The combination recited in claim 1 further including an electronic power switching device and transfer means for applying said trigger pulse to the control terminal of said switching device.

5. The combination recited in claim 1 wherein said first circuit means includes sensor circuit means responsive to an external condition for controlling said first circuit means to generate said trigger pulse only in response to the occurrence of a preselected condition.

6. The combination recited in claim 1 wherein said first circuit means includes sensor circuit means for varying the magnitude of said trigger pulses in response to changes in an external condition.

7. The combination recited in claim 4 wherein said power switching means includes a semiconductor device.

8. The combination recited in claim 4 wherein said power switching device is a silicon controlled rectifier.

9. The combination recited in claim 5 wherein said sensor circuit means comprises, a transistor switch, a condition response resistor means coupled to said switch for changing the state of said switch in response to an external condition, and circuit means for actuating said first and second circuit means in response to the state of said transistor switch.

10. The combination recited in claim 5 wherein said sensor circuit means comprises, circuit means for substantially short circuiting said capacitor upon the occurrence of a preselected condition.

11. The combination recited in claim 5 wherein said sensor circuit means comprises, a semiconductor amplifier having two opposite saturated states, each state of said amplifier corresponding to one state of said power switching device, condition responsive resistor means coupled to said amplifier to drive said amplifier to one of said opposite states upon the occurrence of a preselected condition, means for actuating said first and second circuit means in response to the state of said amplifier.

12. The combination recited in claim 6 wherein said sensor circuit means comprises a condition responsive resistor means in series with said capacitor and in the path of the charging current flowing to said capacitor.

13. The combination recited in claim 8 wherein said silicon controlled rectifier has cathode, anode and gate electrodes, said cathode and anode electrodes being connected across said source, and further including third circuit means for holding said gate electrode at a first potential, and fourth circuit means including said capacitor and diode for driving said cathode electrode to a second potential negative with respect to said first potential near the zero point of said source pulsation.

14. A circuit for generating trigger pulses which are synchronized to a pulsating source comprising, first and second terminals for connection to said source, a first resistor connected to said first terminal and one side of a capacitor, the other side of said capacitor connected to said second terminal, said first resistor and said capacitor forming a charging path for said capacitor having a long time constant relative to the duration of the pulsations of said source, a discharge path coupled to said capacitor having a short time constant relative to the time constant of said charging path and including a diode, and means for reverse biasing said diode during substantially said entire source pulsation while said capacitor is charging and forward biasing said diode near the zero crossover point of said source pulsation to actuate said discharge path, whereby said capacitor is discharged near the zero crossover point of said source pulsation.

* * * * *

UNITED STATES PATENT OFFICE
CERTIFICATE OF CORRECTION

Patent No. 3,671,780 Dated June 20, 1972

Inventor(s) Peter Lefferts

It is certified that error appears in the above-identified patent and that said Letters Patent are hereby corrected as shown below:

In Claim 1, the phrase beginning at column 8, line 34 with "responsive" and ending with the first occurrence of "capacitor" at column 8, line 36, should be cancelled as shown and reinserted in column 8, line 41 after "means".

Signed and sealed this 17th day of October 1972.

(SEAL)
Attest:

EDWARD M.FLETCHER,JR.
Attesting Officer

ROBERT GOTTSCHALK
Commissioner of Patents